United States Patent
Radu et al.

(10) Patent No.: US 9,634,161 B2
(45) Date of Patent: Apr. 25, 2017

(54) NANOSCALE PRECURSORS FOR SYNTHESIS OF $FE_2(SI,GE)(S,SE)_4$ CRYSTALLINE PARTICLES AND LAYERS

(71) Applicants: Daniela Rodica Radu, Hockessin, DE (US); Cheng-Yu Lai, Hockessin, DE (US)

(72) Inventors: Daniela Rodica Radu, Hockessin, DE (US); Cheng-Yu Lai, Hockessin, DE (US)

(73) Assignee: DELAWARE STATE UNIVERSITY, Dover, DE (US)

( * ) Notice: Subject to any disclaimer, the term of this patent is extended or adjusted under 35 U.S.C. 154(b) by 293 days.

(21) Appl. No.: 14/267,428

(22) Filed: May 1, 2014

(65) Prior Publication Data
US 2014/0326316 A1 Nov. 6, 2014

Related U.S. Application Data

(60) Provisional application No. 61/817,890, filed on May 1, 2013.

(51) Int. Cl.
*H01L 31/032* (2006.01)
*H01L 21/02* (2006.01)
(Continued)

(52) U.S. Cl.
CPC ............ *H01L 31/032* (2013.01); *C09D 11/52* (2013.01); *H01L 21/0257* (2013.01);
(Continued)

(58) Field of Classification Search
CPC ............ C09D 11/52; H01L 21/02422; H01L 21/02425; H01L 21/02491;
(Continued)

(56) References Cited

U.S. PATENT DOCUMENTS

2008/0072705 A1* 3/2008 Chaumonnot ......... B01J 23/002
75/338
2011/0240108 A1 10/2011 Law et al.
(Continued)

FOREIGN PATENT DOCUMENTS

WO WO 2010/135622 A1 11/2010
WO WO 2011/066205 A1 6/2011

OTHER PUBLICATIONS

Fredrick et al. J. Am. Chem. Soc. 2013, 135, 18256-18259.*
(Continued)

*Primary Examiner* — Michael A Salvitti
(74) *Attorney, Agent, or Firm* — RatnerPrestia

(57) ABSTRACT

Thin films comprising crystalline $Fe_2XY_4$, wherein X is Si or Ge and Y is S or Se, are obtained by coating an ink comprised of nanoparticle precursors of $Fe_2XY_4$ and/or a non-particulate amorphous substance comprised of Fe, X and Y on a substrate surface and annealing the coating. The coated substrate thereby obtained has utility as a solar absorber material in thin film photovoltaic devices.

8 Claims, 1 Drawing Sheet

(51) Int. Cl.
*H01L 31/072* (2012.01)
*C09D 11/52* (2014.01)

(52) U.S. Cl.
CPC .. *H01L 21/02422* (2013.01); *H01L 21/02425* (2013.01); *H01L 21/02491* (2013.01); *H01L 21/02568* (2013.01); *H01L 21/02601* (2013.01); *H01L 21/02628* (2013.01); *H01L 31/072* (2013.01); *Y02E 10/50* (2013.01)

(58) Field of Classification Search
CPC ........... H01L 21/02568; H01L 21/0257; H01L 21/02601; H01L 21/02628; H01L 31/032; H01L 31/072; Y02E 10/50
See application file for complete search history.

(56) References Cited

U.S. PATENT DOCUMENTS

| | | | |
|---|---|---|---|
| 2012/0055554 A1 | 3/2012 | Radu et al. | |
| 2012/0288987 A1 | 11/2012 | Radu et al. | |
| 2013/0037111 A1* | 2/2013 | Mitzi | H01L 31/0326 136/264 |
| 2013/0125988 A1 | 5/2013 | Cao et al. | |
| 2013/0220405 A1* | 8/2013 | Mahler | B82Y 30/00 136/252 |
| 2013/0233202 A1 | 9/2013 | Cao et al. | |
| 2013/0264526 A1 | 10/2013 | Cao et al. | |
| 2013/0292800 A1 | 11/2013 | Cao et al. | |
| 2014/0048137 A1 | 2/2014 | Cao et al. | |
| 2014/0182665 A1* | 7/2014 | Liang | H01L 31/0749 136/252 |
| 2014/0326316 A1* | 11/2014 | Radu | H01L 31/032 136/261 |

OTHER PUBLICATIONS

Park et al. J. Mater. Chem. A, 2015, 3, 2265.*
Kirkeminde, et al.; *Thermodynamic Control of Iron Pyrite Nanocrystal Synthesis With High Photoactivity and Stability*; J. Mater. Chem. A, 2013, 1, 49-54.
Yu, et al..; *Iron Chalcogenide Photovoltaic Absorbers*; Adv. Energy Mater, 2011, 1, 748-753.
Tadorov, et al; *Beyond 11% Efficiency: Characteristics of State-of-the-Art $Cu_2ZnSn(S,Se)_4$ Solar Cells*; Adv. Energy Mater, 2013, 3, 34-38.
Frederick et al.; *Solution Synthesis and Reactivity of Colloidal $Fe_2GeS_4$: A Potential Candidate for Earth Abundant, Nanostructured Photovoltaics*; Journal of The American Chemical Society; Aug. 2013; pubs.acs.org/JACS; dx.doi.org/10.1021/ja408333y I J. Am Chem Soc.

* cited by examiner

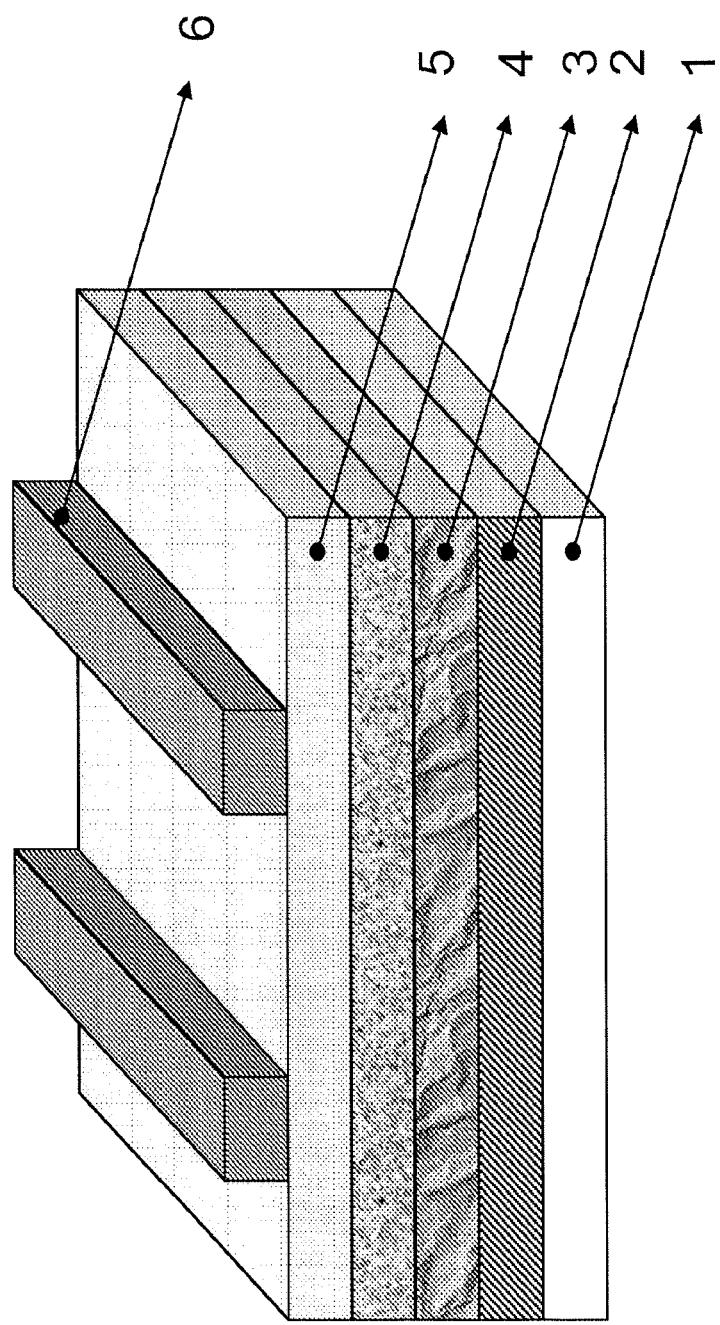

NANOSCALE PRECURSORS FOR SYNTHESIS OF FE$_2$(SI,GE)(S,SE)$_4$ CRYSTALLINE PARTICLES AND LAYERS

CROSS-REFERENCE TO RELATED APPLICATION

This application claims priority to U.S. Provisional Application No. 61/817,890, filed May 1, 2013, the disclosure of which is incorporated herein by reference in its entirety for all purposes.

FIELD OF THE INVENTION

The present invention relates to nanoparticles and non-particulate amorphous substances that are useful precursors for the preparation of crystalline films on substrates that contain materials such as Fe$_2$SiS$_4$ and Fe$_2$GeS$_4$ in thin film crystalline form. Such coated substrates may be utilized in the manufacture of photovoltaic devices and the like.

BACKGROUND OF THE INVENTION

Three forms of thin-film solar panels have been developed and commercialized in the last decade by identifying materials that are both efficient absorbers of solar power and cost-effective for manufacturer and consumer. These materials are: amorphous silicon (a-Si), cadmium telluride (CdTe) and CIGS (copper indium gallium sulfo-selenide). Although they operate effectively in thin-film (1-3 microns) form, there are both environmental and economic concerns for the cost and sustainability of the materials and processes employed in these approaches.

An alternative solution was seen in pursuing sustainable photovoltaic (PV) materials composed of Earth-abundant elements such as Cu$_2$ZnSn(S,Se)$_4$ (copper zinc tin sulfide-CZTS or sulfo-selenide CZTSSe) or FeS$_2$ (iron sulfide) for the absorber layer. CZTSSe, benefiting from CIGS similarities, has already proved itself at efficiencies >12%. However, photovoltaic research using FeS$_2$ absorbers still reports very low efficiencies (~2%) despite this material's potential comparable to a-Si, CdS and CIGS (>20%).

The use of Fe in PV was proposed more than 25 years ago in the form of FeS$_2$. FeS$_2$ (also called pyrite or "fool's gold") is an indirect band gap semiconductor with sustainable composition of abundant elements. Unfortunately, the performance problems associated with this material as a PV absorber are still not fully understood.

The appeal of FeS$_2$, in addition to the material's low cost and abundance, has been that it exhibits a useful band gap ($E_g$=0.9 eV) and an absorption coefficient above $10^5$ at $E_g$+0.1 eV. This high absorption coefficient makes FeS$_2$ unique among inorganic materials, allowing downsizing the thickness of the absorber layer to lower than 0.1 μm in a solar cell able to capture most of the incident solar radiation. The attractiveness of this thickness is visible when compared to 1.5-3.0 μm for current thin-film technologies and >200 μm for single-crystal Si cells. Such thin layers not only conserve material, but they also provide an avenue to high efficiency through efficient charge separation associated with a high internal electrical field. However, the promise of FeS$_2$ as a "golden" solution for PV has not come true to date.

Recently, a large team of scientists from NREL and Oregon State University has investigated the phenomena related to lack of performance in FeS$_2$ and pointed to an intrinsic thermal instability of the material along with considerable challenges that must be surmounted for production of high-quality, single-phase FeS$_2$ films. This work is reported in Yu et al., Advanced Energy Materials 1(5), 748-753 (2011). To circumvent the problem, they have used the following design principle: "select systems that do not spontaneously phase-separate into sulfur (S) deficient conducting materials with small band-gaps." In order to provide a ligand-field splitting of sufficient magnitude for effective solar absorption the Fe$^{2+}$ ion must be bound by at least six S atoms thus assuring a sufficiently large band gap. This generally requires Fe$^{2+}$ in an octahedral site. Adding a third element with an electronegativity that favors strong covalent bonding with sulfur can stabilize such a site. From these considerations, this research group has chosen Fe$_2$SiS$_4$ and Fe$_2$GeS$_4$ for investigation. The analytical evaluations (summarized in Table 1, which is adapted from the aforementioned article in Advanced Energy Materials) led to the conclusion that the two materials are suitable to successfully deliver the performance originally expected from FeS$_2$.

TABLE 1

Fe$_2$SiS$_4$ and Fe$_2$GeS$_4$ evaluation results

| Material | Calculated Direct Bandgap (eV) | Measured Direct Bandgap (eV) | Enthalpy of Decomposition in Binary Sulfides (eV) | TGA Mass Loss Starting Point (° C.) | Calculated Absorption Coefficient (cm$^{-1}$) |
|---|---|---|---|---|---|
| Fe$_2$SiS$_4$ | 1.55 | 1.54 | 0.59 | 1000 | >$10^5$ |
| Fe$_2$GeS$_4$ | 1.4 | 1.36 | 0.64 | 725 | >$10^5$ |

The thermal stability of the two materials along with their close to ideal bandgap for solar cell fabrication makes the two materials good candidates for achieving the initial promise of FeS$_2$.

To date, however, methods for preparing devices containing crystalline Fe$_2$SiS$_4$ and Fe$_2$GeS$_4$ and the like as an absorber layer using nano-scale precursors have not been available.

SUMMARY OF THE INVENTION

One aspect of the invention provides an ink comprising:
a) a plurality of nanoparticles which are precursors to a crystalline thin film comprised of Fe$_2$XY$_4$, wherein X is selected from the group consisting of Si, Ge and combinations thereof and Y is selected from the group consisting of S, Se and combinations thereof; and
b) a vehicle.

For example, the nanoparticles may comprise nanoparticles of FeS$_2$ and nanoparticles of elemental Ge or elemental S. In another embodiment of the invention, the nanoparticles may comprise nanoparticles of FeS$_2$ and nanoparticles of GeS. In yet another embodiment, the nanoparticles may comprise nanoparticles of Fe$_2$XS$_4$, wherein X is selected from the group consisting of Si, Ge and combinations thereof. The vehicle may be a solvent, in particular an organic solvent. According to one embodiment, all of the nanoparticles may have a particle size of less than 200 nm.

Further provided by the present invention is a coated substrate comprising:
a) a substrate; and
b) a layer disposed on the substrate comprising an ink in accordance with the above description.

Still another aspect of the invention provides a method of providing a crystalline thin film comprised of Fe$_2$XY$_4$, wherein X is selected from the group consisting of Si, Ge and combinations thereof and Y is selected from the group consisting of S, Se and combinations thereof, on a substrate, comprising the steps of:
a) coating the substrate with at least one layer of an ink in accordance with the above description; and
b) heating the layer for a time and at a temperature effective to convert the plurality of nanoparticles into the crystalline thin film comprised of $Fe_2XY_4$.

Additionally provided by the present invention is a method of making nanoparticles useful as precursors for forming crystalline thin films comprised of $Fe_2XY_4$, comprising the steps of:
a) combining a source of Fe, a source of X, a source of Y and a capping agent (e.g., a long chain alkyl amine) to form a reaction mixture;
b) heating the reaction mixture for a time and at a temperature effective to form nanoparticles comprised of $Fe_2XY_4$ or an admixture of nanoparticles of X (which may be in elemental form) and nanoparticles of $FeY_2$, wherein X is selected from the group consisting of Si, Ge and combinations thereof and Y is selected from the group consisting of S, Se and combinations thereof.

This method may optionally comprise an additional step after step b) of recovering the nanoparticles from the reaction mixture. To prepare an ink suitable for coating onto a substrate, the recovered nanoparticles may optionally be combined with a vehicle, such as an organic solvent.

The aforementioned method for making nanoparticles may comprise the additional steps after step b) of combining the reaction mixture with a non-solvent (anti-solvent) to precipitate the nanoparticles, isolating the precipitated nanoparticles and redispersing the isolated nanoparticles (for example, in a solvent).

Another aspect of the present invention pertains to an ink comprising:
a) a non-particulate amorphous substance comprised of Fe, X and Y which is a precursor to a crystalline thin film of $Fe_2XY_4$, wherein X is selected from the group consisting of Si, Ge and combinations thereof and Y is selected from the group consisting of S, Se and combinations thereof; and
b) a vehicle.

A coated substrate may also be provided by the present invention comprising:
a) a substrate; and
b) a layer disposed on the substrate comprising an ink containing a non-particulate amorphous substance in accordance with the above description.

A still further aspect of the invention furnishes a method of providing a crystalline thin film comprised of $Fe_2XY_4$, wherein X is selected from the group consisting of Si, Ge and combinations thereof and Y is selected from the group consisting of S, Se and combinations thereof, on a substrate, comprising the steps of:
a) coating the substrate with at least one layer of an ink containing a non-particulate amorphous substance in accordance with the foregoing description; and
b) heating the layer for a time and at a temperature effective to convert the non-particulate amorphous substance into the crystalline thin film comprised of $Fe_2XY_4$.

A method of making an ink is provided in another aspect of the invention, comprising the steps of:
a) combining a source of Fe, a source of X, a source of Y and a capping agent (e.g., a long chain alkyl amine) to form a reaction mixture;
b) heating the reaction mixture for a time and at a temperature effective to form a non-particulate amorphous substance comprised of Fe, X and Y, wherein X is selected from the group consisting of Si, Ge and combinations thereof and Y is selected from the group consisting of S, Se and combinations thereof; and
c) combining the non-particulate amorphous substance with a vehicle to form the ink.

This method may comprise the additional steps after step b) and before step c) of combining the reaction mixture with a non-solvent to precipitate the non-particulate amorphous substance, isolating the precipitated non-particulate amorphous substance and redispersing the isolated non-particulate amorphous substance.

Also provided by the present invention is a nanoparticle comprising, consisting essentially of, or consisting of Fe, X and Y, wherein X is selected from the group consisting of Si, Ge and combinations thereof and Y is selected from the group consisting of S, Se and combinations thereof. For example, the nanoparticle may comprise, consist essentially of, or consist of a) Fe, Si and S, b) Fe, Si and Se, c) Fe, Ge and S, or d) Fe, Ge and Se. The nanoparticle may be additionally comprised of a capping agent. The molar ratio of Fe:X:Y in the nanoparticle may be about 2:1:4. For example, the nanoparticle may be a nanoparticle of $Fe_2SiS_4$, $Fe_2GeS_4$, $Fe_2SiSe_4$, or $Fe_2GeSe_4$.

Additionally provided by the present invention is an admixture comprised of nanoparticles of $FeY_2$ and nanoparticles of elemental X, wherein Y is selected from the group consisting of S, Se and combinations thereof and X is selected from the group consisting of Si, Ge and combinations thereof. The admixture may additionally comprise at least one capping agent. The molar ratio of Fe:X:Y in the admixture may about 2:1:4. For example, the admixture may comprise nanoparticles of $FeS_2$ and nanoparticles of elemental Si or Ge.

DESCRIPTION OF THE FIGURE

The FIGURE shows, in schematic form, a perspective view of a stack of layers in a solar cell.

DETAILED DESCRIPTION OF THE INVENTION

Definitions of Certain Terms

Herein, the terms "solar cell" and "photovoltaic cell" are synonymous unless specifically defined otherwise. These terms refer to devices that use semiconductors to convert visible and near-visible light energy into usable electrical energy. The terms "band gap energy," "optical band gap," and "band gap" are synonymous unless specifically defined otherwise. These terms refer to the energy required to generate electron-hole pairs in a semiconductor material, which in general is the minimum energy needed to excite an electron from the valence band to the conduction band.

Herein, the term "nanoparticles" is meant to include nanoparticles with a variety of shapes that are characterized by an average longest dimension of about 1 nm to about 500 nm. Herein, by nanoparticle "size" or "size range" or "size distribution," we mean that the average longest dimension of a plurality of nanoparticles falls within the range. "Longest dimension" is defined herein as the measurement of a nanoparticle from end to end. The "longest dimension" of a particle will depend on the shape of the particle. For example, for particles that are roughly or substantially spherical, the longest dimension will be a diameter of the particle. For other particles, the longest dimension will be a diagonal or a side.

Herein, the term "crystalline" is meant to refer to a material or substance which exhibits one or more peaks by x-ray diffraction (XRD). As used herein, the term "crystalline" includes both fully and partially crystalline materials or substances.

Herein, the term "amorphous" means a material or substance that does not exhibit at least one peak by x-ray diffraction (XRD).

Inks

One aspect of this invention an ink comprising, consisting essentially of, or consisting of:
  a) nanoparticles and/or a non-particulate amorphous substance which are precursors to a crystalline thin film comprised of $Fe_2XY_4$, wherein X is selected from the group consisting of Si, Ge and combinations thereof and Y is selected from the group consisting of S, Se and combinations thereof; and
  b) a vehicle.

The nanoparticles or non-particulate amorphous substance of component a) are selected to be capable of providing a crystalline thin film comprised of $Fe_2XY_4$ when the ink is coated onto a substrate surface and further processed in accordance with the procedures described further herein. This ink may be considered an $Fe_2XY_4$ precursor ink, as it contains one or more precursors for forming a thin film containing crystalline $Fe_2XY_4$ on the surface of a substrate.

Nanoparticles/Non-Particulate Amorphous Substances

The ink may contain a single type of nanoparticle or non-particulate amorphous substance. That is, all the nanoparticles present in the ink may have the same composition and/or the entirety of the non-particulate amorphous substance may have the same composition. For example, all of the nanoparticles may be nanoparticles of $Fe_2GeS_4$, $Fe_2GeSe_4$, $Fe_2SiS_4$ or $Fe_2SiSe_4$. Multiple types of nanoparticles may also be present in the ink. In one embodiment, mixtures of two or more types of nanoparticles selected from the group consisting of $Fe_2GeS_4$, $Fe_2GeSe_4$, $Fe_2SiS_4$ and $Fe_2SiSe_4$ are utilized. In another embodiment, different types of nanoparticles are selected and combined so as to separately provide the elemental components of the desired crystalline thin film of $Fe_2XY_4$ to be formed on a substrate. For example, nanoparticles of $FeS_2$ may be present in combination with nanoparticles of Ge (as precursors to $Fe_2GeS_4$), nanoparticles of $FeS_2$ may be present in combination with nanoparticles of Si (as precursors to $Fe_2SiS_4$), or nanoparticles of $FeS_2$ may be present in combination with nanoparticles of GeS (as precursors to $Fe_2GeS_4$). Where different types of nanoparticles or non-particulate amorphous substances are used in combination, their relative amounts may be selected in accordance with the desired stoichiometry of Fe, X and Y in the final crystalline thin film on the coated substrate. As an example, in the embodiment where nanoparticles of $FeS_2$ and nanoparticles of Si are used in combination, the molar ratio of $FeS_2$:Si may be about 2:1 in order to provide a crystalline thin film comprised of $Fe_2SiS_4$.

The nanoparticles can have an average longest dimension of less than about 500 nm, 400 nm, 300 nm, 250 nm, 200 nm, 150 nm, or 100 nm, as determined by electron microscopy. In other embodiments, all of the nanoparticles are less than 200 nm, less than 150 nm or less than 100 nm in size with respect to their longest dimension. The nanoparticles may take different forms, depending upon the starting materials and treatment conditions; for example, the nanoparticles may be spheroidal, block-shaped or in the form of platelets. In at least certain embodiments of the invention, the nanoparticles are at least partially crystalline. The nanoparticles can be synthesized by techniques such as: decomposition and reduction of metal salts and complexes; chemical vapor deposition; electrochemical deposition; use of gamma-, x-ray, laser or UV-irradiation; ultrasonic (sonication) or microwave treatment; electron- or ion-beams; arc discharge; electric explosion of wires; or biosynthesis.

The nanoparticles may, in certain embodiments of the invention, comprise, consist essentially of, or consist of Fe, X and Y, wherein X is selected from the group consisting of Si, Ge and combinations thereof and Y is selected from the group consisting of S, Se and combinations thereof. For example, the nanoparticles may comprise, consist essentially of, or consist of a) Fe, Si and S, b) Fe, Si and Se, c) Fe, Ge and S, or d) Fe, Ge and Se. The nanoparticles may be additionally comprised of a capping agent, as described below. The molar ratio of Fe:X:Y in the nanoparticles may be about 2:1:4.

Illustrative embodiments of the invention include, for example, nanoparticles of $Fe_2XY_4$ (e.g., $Fe_2SiS_4$, $Fe_2SiSe_4$, $Fe_2GeS_4$, $Fe_2GeSe_4$), optionally in combination with one or more capping agents; and admixtures of nanoparticles of X (Si, Ge) and nanoparticles of $FeY_2$ (Y=S, Se), optionally in combination with one or more capping agents.

Capping Agent

In some embodiments, the nanoparticles and/or non-particulate amorphous substance further comprise one or more capping agents. The capping agent can aid in the dispersion of the nanoparticles or non-particulate amorphous substance and can also inhibit their interaction and agglomeration in the ink.

Suitable capping agents include, but are not limited to:
  (a) Organic molecules that contain functional groups such as N-, O-, S-, Se- or P-based functional groups;
  (b) Lewis bases;
  (c) Amines, thiols, selenols, phosphine oxides, phosphines, phosphinic acids, pyrrolidones, pyridines, carboxylates, phosphates, heteroaromatics, peptides, and alcohols;
  (d) Alkyl amines (e.g., long chain alkyl amines, such as C8-C22 saturated or unsaturated alkyl amines, e.g., oleylamine, decylamine, dodecylamine, hexadecylamine, octadecylamine), alkyl thiols, alkyl selenols, trialkylphosphine oxide, trialkylphosphines, alkylphosphonic acids, polyvinylpyrrolidone, polycarboxylates, polyphosphates, polyamines, pyridine, alkylpyridines, aminopyridines, peptides comprising cysteine and/or histidine residues, ethanolamines, citrates, thioglycolic acid, oleic acid, and polyethylene glycol;
  (e) inorganic chalcogenides, including metal chalcogenides, and zintl ions;
  (f) $S^{2-}$, $Se^{2-}$, $Se_2^{2-}$, $Se_3^{2-}$, $Se_4^{2-}$, $Se_6^{2-}$, $Te^{2-}$, $Te_3^{2-}$, $Te_4^{2-}$, $In_2Se_4^{2-}$, and $In_2Te_4^{2-}$, wherein the positively charged counterions can be alkali metal ions, ammonium, hydrazinium, or tetraalkylammonium;
  (g) Degradable capping agents, including dichalcogenocarbamates, monochalcogenocarbamates, xanthates, trithiocarbonates, dichalcogenoimidodiphosphates, thiobiurets, dithiobiurets, chalcogenosemicarbazides, and tetrazoles. These capping agents can be degraded by thermal and/or chemical processes, such as acid- and base-catalyzed processes. Degradable capping agents include: dialkyl dithiocarbamates, dialkyl monothiocarbamates, dialkyl diselenocarbamates, dialkyl monoselenocarbamates, alkyl xanthates, alkyl trithiocarbonates, disulfidoimidodiphosphates, diselenoimidodiphosphates, tetraalkyl thiobiurets, tetraalkyl dithiobiurets, thiosemicarbazides, selenosemicarbazides, tetrazole, alkyl tetrazoles, amino-tetrazoles, thio-tetrazoles, and carboxylated tetrazoles. In some embodiments, Lewis bases (e.g., amines) can be added to nanoparticles stabilized by carbamate, xanthate, and trithiocarbonate capping agents to catalyze their removal from the nanoparticle;

(h) The solvent in which the nanoparticle or non-particulate amorphous substance is formed, such as oleylamine; and (i) Short-chain carboxylic acids, such as formic, acetic, or oxalic acids.

The Lewis base can be chosen such that it has a boiling temperature at ambient pressure that is greater than or equal to about 200° C., 150° C., 120° C., or 100° C., and/or can be selected from the group consisting of: organic amines, phosphine oxides, phosphines, thiols, and mixtures thereof. In some embodiments, the capping agent comprises a surfactant or a dispersant.

Volatile Capping Agents

In some embodiments, the nanoparticles and/or non-particulate amorphous substance comprise a volatile capping agent. A capping agent is considered volatile if, instead of decomposing and introducing impurities when a composition or ink of nanoparticles or non-particulate amorphous substance is formed into a film, it evaporates during film deposition, drying or annealing. Volatile capping agents include those having a boiling point less than about 200° C., 150° C., 120° C., or 100° C. at ambient pressure. Volatile capping agents may be adsorbed or bonded onto particles during synthesis or during an exchange reaction. Thus, in one embodiment, nanoparticles, or an ink or reaction mixture of nanoparticles stabilized by a first capping agent, as incorporated during synthesis, are mixed with a second capping agent that has greater volatility to exchange in the particles the second capping agent for the first capping agent. Suitable volatile capping agents include: ammonia, methyl amine, ethyl amine, propylamine, butylamine, tetramethylethylene diamine, acetonitrile, ethyl acetate, butanol, pyridine, ethanethiol, propanethiol, butanethiol, t-butylthiol, pentanethiol, hexanethiol, tetrahydrofuran, and diethyl ether. Suitable volatile capping agents can also include: amines, amidos, amides, nitriles, isonitriles, cyanates, isocyanates, thiocyanates, isothiocyanates, azides, thiocarbonyls, thiols, thiolates, sulfides, sulfinates, sulfonates, phosphates, phosphines, phosphites, hydroxyls, hydroxides, alcohols, alcoholates, phenols, phenolates, ethers, carbonyls, carboxylates, carboxylic acids, carboxylic acid anhydrides, glycidyls, and mixtures thereof.

Preparation of Nanoparticles and Non-Particulate Amorphous Substances

As previously mentioned, the ink may comprise nanoparticles of $Fe_2XY_4$, such as nanoparticles of $Fe_2SiS_4$ or $Fe_2GeS_4$; nanoparticles of $FeY_2$ and nanoparticles of X; and/or a non-particulate amorphous substance comprised of Fe, X and Y. The nanoparticles and non-particulate amorphous substance may be prepared in accordance with the following procedure. Dispersions and/or solutions of a source of Fe, a source of Si and/or Ge, and a source of S and/or Se are separately prepared by combining each starting material with a capping agent such as oleylamine to obtain an initial mixture and treating each initial mixture with ultrasound while heating (e.g., at a temperature of from about 70° C. to about 150° C.) to yield a dispersion or solution (in some embodiments, colloids of the starting materials are obtained). The dispersions/solutions are then combined (in the stoichiometry needed) and the combined dispersions/solutions (the reaction mixture) then heated for a time (e.g., about 0.2 to about 10 hours) and at a temperature (e.g., about 150° C. to about 300° C.) effective to achieve reaction of the starting materials, thereby forming the desired nanoparticles and/or non-particulate amorphous substance. The starting components may be stirred or otherwise agitated during heating; microwaves may be used to assist during this heating step. Generally speaking, longer heating times tend to favor the formation of nanoparticles whereas shorter heating times tend to favor the generation of the non-particulate amorphous substance. Mixtures of nanoparticles and non-particulate amorphous substance may result when intermediate reaction times are utilized. The heating can be conducted under an inert atmosphere (e.g., an argon atmosphere). The nanoparticles and/or non-particulate amorphous substance can be isolated, for example, by precipitation by a non-solvent followed by centrifugation, and can be further purified by washing and repeated dispersion precipitation steps. In one embodiment, the nanoparticles or non-particulate amorphous substance are/is precipitated using a non-solvent which is a mixture of aliphatic hydrocarbons and alcohol (e.g., a mixture of hexanes and ethanol). In another embodiment, the nanoparticles/non-particulate amorphous substance isolated by precipitation are/is dispersed in a dispersion solvent such as an aromatic hydrocarbon (e.g., toluene), prior to being re-precipitated.

The sources of Fe, Si/Ge and S/Se may be in elemental or compound form. A single starting material may function as a source of more than one of the components needed to ultimately form the desired nanoparticles or non-particulate amorphous substance. Suitable sources of Fe include iron compounds such as, for example, iron halides (e.g., $FeCl_2$) and organoiron complexes (e.g., $Fe(acac)_3$). Suitable sources of Si and Ge include, for example, elemental Si and Ge halides (such as $GeI_4$). Suitable sources of S and Se include, for example, elemental S. The sources of Fe, Si/Ge and S/Se may be in nanoparticulate form or non-nanoparticulate form. In one embodiment, a source of Fe, Si/Ge or S/Se is initially in non-nanoparticulate form but then converted to nanoparticulate form prior to being combined with the other sources, using techniques such as sonication, heating milling, grinding or the like. The relative amounts of the Fe source, the Si/Ge source and the S/Se source may be selected to provide the stoichiometry needed to attain the desired crystalline $Fe_2XY_4$ in the final annealed coating. Accordingly, the source of Fe, the source of Si/Ge and the source of S/Se may be combined in amounts appropriate to provide a Fe:(Si/Ge):(S/Se) stoichiometry of about 2:1:4.

One exemplary method for making a nanoprecursor mixture useful for preparing a thin film comprised of crystalline $Fe_2SiS_4$ comprises the following steps:

a) forming a reaction mixture comprised of an Fe compound (e.g., $FeCl_2$), elemental S, and elemental Si in a long chain alkyl amine (for example, by combining a solution of $FeCl_2$ in the long chain alkyl amine, a solution of elemental S in the long chain alkyl amine, and a dispersion of elemental Si (which may be in nanoparticulate form) in the long chain alkyl amine);

b) heating the reaction mixture for about 0.2 to about 5 hours, optionally under an inert atmosphere, at a temperature of from about 175° C. to about 300° C. to form a nanoparticulate reaction product comprised of nanoparticles of elemental Si and nanoparticles of $FeS_2$;

c) precipitating the nanoparticles formed in step b) by combining a first anti-solvent (e.g., a hexanes:ethanol mixture) with the nanoparticulate reaction product;

d) isolating the precipitated nanoparticles from step c) (by centrifugation, for example);

e) redispersing the isolated nanoparticles from step d) in a solvent (e.g., toluene);
f) reprecipitating the redispersed nanoparticles from step e) by combining a second anti-solvent (which may be the same as or different from the first anti-solvent) with the redispersed nanoparticles from step e); and
g) isolating the precipitated nanoparticles from step f) (by centrifugation, for example).

The amounts of Fe compound, S and Si utilized in step a) may be selected to provide a molar ratio of Fe:Si:S of about 2:1:4. Steps e)-g) may be repeated multiple times as may be needed or desired in order to remove excess capping agent and/or other substances from the nanoparticle mixture. The isolated nanoparticle mixture may be combined with a vehicle, such as an organic solvent, as well as one or more additional optional addives to provide an ink suitable for coating onto a substrate and annealing to form a thin film of crystalline $Fe_2SiS_4$ on the substrate surface, as described elsewhere herein.

One exemplary method for making a nanoprecursor mixture useful for preparing a thin film comprised of crystalline $Fe_2GeS_4$ comprises the following steps:
a) forming a reaction mixture comprised of an Fe compound (e.g., $FeCl_2$, $Fe(acac)_3$), elemental S, and a Ge compound (e.g. $GeI_4$) in a long chain alkyl amine (for example, by combining a solution of the Fe compound in the long chain alkyl amine, a solution of elemental S in the long chain alkyl amine, and a solution of elemental Ge in the long chain alkyl amine);
b) heating the reaction mixture for about 0.2 to about 5 hours, optionally under an inert atmosphere, at a temperature of from about 175° C. to about 300° C. to form a nanoparticulate reaction product comprised of nanoparticles of elemental Ge and nanoparticles of $FeS_2$;
c) precipitating the nanoparticles formed in step b) by combining a first anti-solvent (e.g., a mixture of hexanes and ethanol) with the nanoparticulate reaction product;
d) isolating the precipitated nanoparticles from step c) (by centrifugation, for example);
e) redispersing the isolated nanoparticles from step d) in a solvent (e.g., toluene);
f) reprecipitating the redispersed nanoparticles from step e) by combining a second anti-solvent (which may be the same as or different from the first anti-solvent) with the redispersed nanoparticles from step e); and
g) isolating the precipitated nanoparticles from step f) (by centrifugation, for example).

The amounts of Fe compound, S and Ge compound utilized in step a) may be selected to provide a molar ratio of Fe:Si:S of about 2:1:4. Steps e)-g) may be repeated multiple times as may be needed or desired in order to remove excess capping agent and/or other substances from the nanoparticle mixture. The isolated nanoparticle mixture may be combined with a vehicle, such as an organic solvent, as well as one or more additional optional addives to provide an ink suitable for coating onto a substrate and annealing to form a thin film of crystalline $Fe_2GeS_4$ on the substrate surface, as described elsewhere herein.

One exemplary method for making a nanoprecursor comprised of $Fe_2GeS_4$ nanoparticles useful for preparing a thin film comprised of crystalline $Fe_2GeS_4$ comprises the following steps:
a) forming a reaction mixture comprised of an Fe compound (e.g., $FeCl_2$, $Fe(acac)_3$), elemental S, and a Ge compound (e.g. $GeI_4$) in a long chain alkyl amine (for example, by combining a solution of the Fe compound in the long chain alkyl amine, a solution of elemental S in the long chain alkyl amine, and a solution of elemental Ge in the long chain alkyl amine); and
b) heating the reaction mixture for about 0.2 to about 5 hours, optionally under an inert atmosphere and optionally while exposing the reaction mixture to microwaves, at a temperature of from about 175° C. to about 300° C. to form a nanoparticulate reaction product comprised of nanoparticles of $Fe_2GeS_4$.

The amounts of Fe compound, S and Ge compound utilized in step a) may be selected to provide a molar ratio of Fe:Si:S of about 2:1:4. The nanoparticles formed in step b) may be precipitated by combining a first anti-solvent (e.g., a mixture of hexanes and ethanol) with the nanoparticulate reaction product. The precipitated nanoparticles may be isolated (by centrifugation, for example). The isolated nanoparticles may be redispersed in a solvent (e.g., toluene). The redispersed nanoparticles may be reprecipitated by combining a second anti-solvent (which may be the same as or different from the first anti-solvent) with the redispersed nanoparticles. The precipitated nanoparticles may be isolated again (by centrifugation, for example). These steps may be repeated multiple times, if so desired. The nanoparticles of $Fe_2GeS_4$ thereby obtained may be combined with a vehicle to provide an ink.

A non-particulate amorphous substance useful as a precursor for forming a thin film comprised of crystalline $Fe_2GeS_4$ on a substrate surface (to provide, for example, an absorber layer in a photovoltaic device or the like) may be prepared in an analogous manner according to the above-described procedure, except that the reaction conditions of step b) are milder (e.g., a shorter heating time, typically about 0.5 to about 1.5 hours).

Vehicle

The ink comprises a vehicle to carry the nanoparticles. The vehicle is typically a fluid or a low-melting solid with a melting point of less than about 100° C., 90° C., 80° C., 70° C., 60° C., 50° C., 40° C., or 30° C. In some embodiments, the vehicle comprises one or more solvents. Suitable solvents include, but are not limited to: aromatics, heteroaromatics, alkanes, chlorinated alkanes, ketones, esters, nitriles, amides, amines, thiols, selenols, pyrrolidinones, ethers, thioethers, selenoethers, alcohols, water, and mixtures thereof. Useful examples of these solvents include toluene, p-xylene, mesitylene, benzene, chlorobenzene, dichlorobenzene, trichlorobenzene, pyridine, 2-aminopyridine, 3-aminopyridine, 2,2,4-trimethylpentane, n-octane, n-hexane, n-heptane, n-pentane, cyclohexane, chloroform, dichloromethane, 1,1,1-trichloroethane, 1,1,2-trichloroethane, 1,1,2,2-tetrachloroethane, 2-butanone, acetone, acetophenone, ethyl acetate, acetonitrile, benzonitrile, N,N-dimethylformamide, butylamine, hexylamine, octylamine, 3-methoxypropylamine, 2-methylbutylamine, isoamylamine, 1-propanethiol, 1-butanethiol, 2-butanethiol, 2-methyl-1-propanethiol, t-butyl thiol, 1-pentanethiol, 3-methyl-1-butanethiol, cyclopentanethiol, 1-hexanethiol, cyclohexanethiol, 1-heptanethiol, 1-octanethiol, 2-ethyhexanethiol, 1-nonanethiol, tert-nonyl mercaptan, 1-decanethiol, mercaptoethanol, 4-cyano-1-butanethiol, butyl 3-mercaptoproprionate, methyl 3-mercaptoproprionate, 1-mercapto-2-propanol, 3-mercapto-1-propanol, 4-mercapto-1-butanol, 6-mercapto-1-hexanol, 2-phenylethanethiol, thiophenol, N-methyl-2-pyrrolidinone, tetrahydrofuran, 2,5-dimethylfuran, diethyl ether, ethylene glycol diethyl ether, diethylsulfide, diethylselenide, 2-methoxyethanol, isopropanol, butanol, ethanol, methanol and mixtures thereof.

In some embodiments, the wt % of the vehicle in the ink is about 95 to about 5 wt %, 95 to 50 wt %, 95 to 60 wt %, 95 to 70 wt %, 95 to 80 wt %, 90 to 10 wt %, 80 to 20 wt %, 70 to 30 wt %, 60 to 40 wt %, 98 to 50 wt %, 98 to 60 wt %, 98 to 70 wt %, 98 to 75 wt %, 98 to 80 wt %, 98 to 85 wt %, 95 to 75 wt %, 95 to 80 wt %, or 95 to 85 wt % based upon the total weight of the ink. In some embodiments, the vehicle may function as a dispersant or capping agent, as well as being the carrier vehicle for the nanoparticles and/or non-particulate amorphous substance. Solvent-based vehicles that are particularly useful as capping agents comprise heteroaromatics, amines, thiols, selenols, thioethers, or selenoethers.

Additional Ink Components

In various embodiments, the ink may further comprise additive(s), an elemental chalcogen, or mixtures thereof.

Additives

In some embodiments, the ink may further comprise one or more additives. Suitable additives include dispersants, surfactants, polymers, binders, ligands, capping agents, defoamers, thickening agents, corrosion inhibitors, plasticizers, thixotropic agents, viscosity modifiers, and dopants. In some embodiments, additives are selected from the group consisting of: capping agents, dopants, polymers, and surfactants. In some embodiments, the ink comprises up to about 10 wt %, 7.5 wt %, 5 wt %, 2.5 wt % or 1 wt % additives, based upon the total weight of the ink. Suitable capping agents comprise the capping agents, including volatile capping agents, described above.

Dopants

Suitable dopants include sodium and alkali-containing compounds. In some embodiments, the alkali-containing compounds are selected from the group consisting of: alkali compounds comprising N-, O-, C-, S-, or Se-based organic ligands, alkali sulfides, alkali selenides, and mixtures thereof. In other embodiments, the dopant comprises an alkali-containing compound selected from the group consisting of: alkali-compounds comprising amidos; alkoxides; acetylacetonates; carboxylates; hydrocarbyls; O-, N-, S-, Se-, halogen-, or tri(hydrocarbyl)silyl-substituted hydrocarbyls; thiolates and selenolates; thio-, seleno-, and dithiocarboxylates; dithio-, diseleno-, and thioselenocarbamates; and dithioxanthogenates. Other suitable dopants include antimony chalcogenides selected from the group consisting of antimony sulfide and antimony selenide.

Polymers and Surfactants

Suitable polymeric additives include vinylpyrrolidone-vinylacetate copolymers and (meth)acrylate copolymers, including PVP/VA E-535 (International Specialty Products), and Elvacite® 2028 binder and Elvacite® 2008 binder (Lucite International, Inc.). In some embodiments, polymers can function as binders or dispersants.

Suitable surfactants comprise siloxy-, fluoryl-, alkyl-, alkynyl-, and ammonium-substituted surfactants. These include, for example, Byk® surfactants (Byk Chemie), Zonyl.RTM. surfactants (DuPont), Triton® surfactants (Dow), Surfynol® surfactants (Air Products), Dynol® surfactants (Air Products), and Tego® surfactants (Evonik Industries AG). In certain embodiments, surfactants function as coating aids, capping agents, or dispersants.

In some embodiments, the ink comprises one or more binders or surfactants selected from the group consisting of: decomposable binders; decomposable surfactants; cleavable surfactants; surfactants with a boiling point less than about 250° C.; and mixtures thereof. Suitable decomposable binders include: homo- and co-polymers of polyethers; homo- and co-polymers of polylactides; homo- and co-polymers of polycarbonates including, for example, Novomer PPC (Novomer, Inc.); homo- and co-polymers of poly[3-hydroxybutyric acid]; homo- and co-polymers of polymethacrylates; and mixtures thereof. A suitable low-boiling surfactant is Surfynol® 61 surfactant from Air Products. Cleavable surfactants useful herein as capping agents include Diels-Alder adducts, thiirane oxides, sulfones, acetals, ketals, carbonates, and ortho esters. Suitable cleavable surfactants include: alkyl-substituted Diels Alder adducts, Diels Alder adducts of furans; thiirane oxide; alkyl thiirane oxides; aryl thiirane oxides; piperylene sulfone, butadiene sulfone, isoprene sulfone, 2,5-dihydro-3-thiophene carboxylic acid-1,1-dioxide-alkyl esters, alkyl acetals, alkyl ketals, alkyl 1,3-dioxolanes, alkyl 1,3-dioxanes, hydroxyl acetals, alkyl glucosides, ether acetals, polyoxyethylene acetals, alkyl carbonates, ether carbonates, polyoxyethylene carbonates, ortho esters of formates, alkyl ortho esters, ether ortho esters, and polyoxyethylene ortho esters.

Elemental Chalcogen

In some embodiments, the ink comprises an elemental chalcogen selected from the group consisting of sulfur, selenium, and mixtures thereof. Useful forms of sulfur and selenium include powders that can be obtained from Sigma-Aldrich (St. Louis, Mo.) and Alfa Aesar (Ward Hill, Mass.). In some embodiments, the chalcogen powder is soluble in the ink vehicle. If the chalcogen is not soluble in the vehicle, its particle size can be 1 nm to 200 microns. In some embodiments, the particles have an average longest dimension of less than about 100 microns, 50 microns, 25 microns, 10 microns, 5 microns, 4 microns, 3 microns, 2 microns, 1.5 microns, 1.25 microns, 1.0 micron, 0.75 micron, 0.5 micron, 0.25 micron, or 0.1 micron. Preferably, the chalcogen particles are smaller than the thickness of the film that is to be formed. The chalcogen particles can be formed by ball milling, evaporation-condensation, melting and spraying ("atomization") to form droplets, or emulsification to form colloids.

Ink Preparation

Preparing the ink typically comprises mixing the components by any conventional method. In some embodiments, the preparation is conducted under an inert atmosphere.

Substrate

The substrate onto which the ink is disposed can be rigid or flexible. In one embodiment, the substrate comprises: (i) a base; and (ii) optionally, an electrically conductive coating on the base. The base material may selected from the group consisting of glass, metals, ceramics, and polymeric films. Suitable base materials include metal foils, plastics, polymers, metalized plastics, glass, solar glass, low-iron glass, green glass, soda-lime glass, metalized glass, steel, stainless steel, aluminum, ceramics, metal plates, metalized ceramic plates, and metalized polymer plates. In some embodiments, the base material comprises a filled polymer (e.g., a polyimide and an inorganic filler). In some embodiments, the base material comprises a metal (e.g., stainless steel) coated with a thin insulating layer (e.g., alumina).

Suitable electrically conductive coatings include metal conductors, transparent conducting oxides, and organic conductors. Of particular interest are substrates of molybdenum-coated soda-lime glass, molybdenum-coated polyimide films, and molybdenum-coated polyimide films further comprising a thin layer of a sodium compound (e.g., NaF, $Na_2S$, or $Na_2Se$).

Ink Deposition

The ink may be disposed on a substrate to provide a coated substrate by any suitable method such as solution-based coating or printing techniques, including spin-coating, spray-coating, dip-coating, rod-coating, drop-cast coating, roller-coating, slot-die coating, draw-down coating, ink-jet printing, contact printing, gravure printing, flexographic printing, and screen printing. The coating can be dried by evaporation, by applying vacuum, by heating, or by combinations thereof. In some embodiments, the substrate and disposed ink are heated at a temperature effective to remove at least a portion of the solvent. The drying step can be a separate, distinct step, or can occur as the substrate and precursor ink are heated in an annealing step. For example, an initial drying step could be carried out at a relatively low temperature of from about 100° C. to about 200° C., followed by an annealing step at a substantially higher temperature (e.g., about 500° C. to about 600° C.).

Annealing

In some embodiments, the coated substrate is heated in an annealing step at about 100-900° C., 200-800° C., 250-800° C., 300-800° C., 400-700° C., or 450-600° C. The annealing conditions may be selected to promote or achieve the formation of a layer comprised of crystalline $Fe_2SiS_4$, $Fe_2GeS_4$, $Fe_2SiSe_4$ or $Fe_2GeSe_4$ on the surface of the substrate. In some embodiments, the coated substrate is heated for a time in the range of about 1 min to about 48 h; 1 min to about 30 min; 10 min to about 10 h; 15 min to about 5 h; 20 min to about 3 h; or, 30 min to about 2 h. Typically, the annealing may comprise thermal processing, rapid thermal processing (RTP), rapid thermal annealing (RTA), pulsed thermal processing (PTP), laser beam exposure, heating via IR lamps, electron beam exposure, pulsed electron beam processing, heating via microwave irradiation, or combinations thereof. Herein, RTP refers to a technology that can be used in place of standard furnaces and involves single-wafer processing, and fast heating and cooling rates. RTA is a subset of RTP, and consists of unique heat treatments for different effects, including activation of dopants, changing substrate interfaces, densifying and changing states of films, repairing damage, and moving dopants. Rapid thermal anneals are performed using either lamp-based heating, a hot chuck, or a hot plate. PTP involves thermally annealing structures at extremely high power densities for periods of very short duration, resulting, for example, in defect reduction. Similarly, pulsed electron beam processing uses a pulsed high energy electron beam with short pulse duration. Pulsed processing is useful for processing thin films on temperature-sensitive substrates. The duration of the pulse is so short that little energy is transferred to the substrate, leaving it undamaged.

In some embodiments, the annealing is carried out under an atmosphere comprising: an inert gas (nitrogen or a Group VIIIA gas, particularly argon); optionally hydrogen; and optionally, a chalcogen source such as selenium vapor, sulfur vapor, hydrogen sulfide, hydrogen selenide, diethyl selenide, or mixtures thereof. In some embodiments, the annealing is conducted with slow heating and/or cooling steps, e.g., temperature ramps and declines of less than about 15° C. per min, 10° C. per min, 5° C. per min, 2° C. per min, or 1° C. per min. In other embodiments, the annealing is conducted with rapid and/or cooling steps, e.g., temperature ramps and declines of greater than about 15° C. per min, 20° C. per min, 30° C. per min, 45° C. per min, or 60° C. per min.

Additional Layers

In some embodiments, the coated substrate further comprises one or more additional layers. These one or more layers can be of the same composition as the first layer comprised of crystalline $Fe_2XY_4$ or can differ in composition. For example, a first ink may be coated onto the surface of the substrate and dried to provide a first layer, with a second ink then coated onto the top surface of the first layer and then dried to provide a second layer, with this procedure being repeated with additional inks to form additional layers. The first, second and additional inks may be the same as, or different from, each other. At least partial annealing may be performed prior to placing successive layers onto the substrate. Alternatively, annealing may be postponed until all the desired layers of dried ink have been formed on the substrate surface.

Coating and Film Thickness

By varying the ink concentration and/or coating technique and temperature, layers of varying thickness can be coated in a single coating step. In some embodiments, the coating thickness can be increased by repeating the coating and drying steps. These multiple coatings can be conducted with the same ink or with different inks. As described above, wherein two or more inks are mixed, the coating of multiple layers with different inks can be used to fine-tune the stoichiometry and purity of the thin films comprised of $Fe_2XY_4$. It can also be used to tune the absorption of the film, e.g., by creating films with gradient $Fe_2XY_4$ compositions. Soft-bake and annealing steps can be carried out between the coating of multiple layers. In these instances, the coating of multiple layers with different inks can be used to create layers having different compositions and characteristics. The coating of multiple layers can also be used to fill in voids in the at least one layer and planarize or create an underlayer to the at least one layer.

The annealed film typically has an increased density and/or reduced thickness versus that of the wet precursor layer. In some embodiments, the film thicknesses of the dried and annealed coatings are 0.1-200 microns; 0.1-100 microns; 0.1-50 microns; 0.1-25 microns; 0.1-10 microns; 0.1-5 microns; 0.1-3 microns; 0.3-3 microns; or 0.5-2 microns.

Purification of Coated Layers and Films

Application of multiple coatings, washing the coating, and/or exchanging capping agents can serve to reduce carbon-based impurities in the coatings and films. For example, after an initial coating, the coated substrate can be dried and then a second coating can be applied and coated by spin-coating. The spin-coating step can wash organics out of the first coating. Alternatively, the coated film can be soaked in a solvent and then spun to wash out the organics. Examples of useful solvents for removing organics in the coatings include alcohols, e.g., methanol or ethanol, and hydrocarbons, e.g., toluene. As another example, dip-coating the substrate into the ink can be alternated with dip-coating the coated substrate into a bath to remove impurities and capping agents. Removal of non-volatile capping agents from the coating can be further facilitated by exchanging these capping agents with volatile capping agents. For example, the volatile capping agent can be used as the washing solution or as a component in a bath. In some embodiments, a layer of a coated substrate comprising a first capping agent is contacted with a second capping agent, thereby replacing the first capping agent with the second capping agent to form a second coated substrate. Advantages of this method include film densification along with lower levels of carbon-based impurities in the film, particularly if and when it is later annealed. Alternatively, binary sulfides and other impurities can be removed by etching.

Preparation of Devices, Including Thin-Film Photovoltaic Cells

Various electrical elements that can be formed, at least in part, by the use of the materials described herein include electronic circuitry, resistors, capacitors, diodes, rectifiers, electroluminescent lamps, memory elements, field effect transistors, bipolar transistors, unijunction transistors, thin film transistors, metal-insulator-semiconductor stacks, charge coupled devices, insulator-metal-insulator stacks, organic conductor-metal-organic conductor stacks, integrated circuits, photodetectors, lasers, lenses, waveguides, gratings, holographic elements, filters (e.g., add-drop filters, gain-flattening filters, and cut-off filters), mirrors, splitters, couplers, combiners, modulators, sensors (e.g., evanescent sensors, phase modulation sensors, and interferometric sensors), optical cavities, piezo-electric devices, ferroelectric devices, thin film batteries, and photovoltaic devices. Combinations can also be useful, for example, the combination of field effect transistors and organic electroluminescent lamps as an active matrix array for an optical display.

A typical photovoltaic cell includes a substrate, a back contact layer (e.g., molybdenum), an absorber layer (also referred to as the first semiconductor layer), a buffer layer (also referred to as the second semiconductor layer), and a top contact layer. The absorber layer may comprise a thin film of crystalline $Fe_2XY_4$ in accordance with the present invention. The photovoltaic cell can also include an electrical contact or electrode pad on the top contact layer, and an anti-reflective (AR) coating on the front (light-facing) surface of the substrate to enhance the transmission of light into the semiconductor layer.

One aspect of the present invention is a process comprising depositing one or more layer(s) in layered sequence onto the annealed crystalline $Fe_2XY_4$-containing coating of the substrate. The layer(s) can be selected from the group consisting of: conductors, semiconductors, and dielectrics. In one embodiment, the process provides a photovoltaic device and comprises depositing the following layers in layered sequence onto the annealed coating of the substrate having an electrically conductive layer present: (i) a buffer layer; (ii) a transparent top contact layer, and (iii) optionally, an antireflective layer.

Another aspect of the present invention is a device made by the process comprising depositing one or more layer(s) in layered sequence onto the annealed crystalline $Fe_2XY_4$-containing coating of the substrate.

Suitable substrate materials for the photovoltaic cell substrate are as described above and below. The photovoltaic cell substrate can also comprise an interfacial layer to promote adhesion between the substrate material and metal layer. Suitable interfacial layers can comprise metals (e.g., V, W, Cr), glass, or compounds of nitrides, oxides, and/or carbides.

Typical photovoltaic cell substrates are glass or plastic, coated on one side with a conductive material, e.g., a metal. In one embodiment, the substrate is molybdenum-coated glass.

Depositing and annealing the crystalline $Fe_2XY_4$-containing layer on the photovoltaic cell substrate to form an absorber layer can be carried out as described above. A suitable crystalline $Fe_2XY_4$-containing layer for a photovoltaic cell comprises a single-formula crystalline $Fe_2XY_4$ fraction that is selected from the group consisting of: crystalline $Fe_2SiS_4$, crystalline $Fe_2SiSe_4$, crystalline $Fe_2GeS_4$, and crystalline $Fe_2GeSe_4$.

The buffer layer typically comprises an inorganic material such as CdS, ZnS, zinc hydroxide, Zn (S, O, OH), cadmium zinc sulfides, $In(OH)_3$, $In_2S_3$, ZnSe, zinc indium selenides, indium selenides, zinc magnesium oxides, or n-type organic materials, or combinations thereof. Layers of these materials can be deposited by chemical bath deposition, atomic layer deposition, coevaporation, sputtering or chemical surface deposition to a thickness of about 2 nm to about 1000 nm, or from about 5 nm to about 500 nm, or from about 10 nm to about 300 nm, or 40 nm to 100 nm, or 50 nm to 80 nm.

The top contact layer is typically a transparent conducting oxide, e.g., zinc oxide, aluminum-doped zinc oxide, indium tin oxide, or cadmium stannate. Suitable deposition techniques include sputtering, evaporation, chemical bath deposition, electroplating, chemical vapor deposition, physical vapor deposition, and atomic layer deposition. Alternatively, the top contact layer can comprise a transparent conductive polymeric layer, e.g., poly-3,4-ethylenedioxythiophene (PEDOT) doped with poly(styrenesulfonate) (PSS), which can be deposited by standard methods, including spin coating, dip-coating or spray coating. In some embodiments, the PEDOT is treated to remove acidic components to reduce the potential of acid-induced degradation of the photovoltaic cell components.

In one embodiment, the photovoltaic cell substrate coated with a crystalline $Fe_2XY_4$-containing film is placed in a cadmium sulfide bath to deposit a layer of CdS. Alternatively, CdS can be deposited on the crystalline $Fe_2XY_4$-containing film by placing the coated substrate in a cadmium iodide bath containing thiourea.

In one embodiment, the photovoltaic cell is fabricated using a sputtered layer of insulating zinc oxide in place of CdS. In some embodiments, CdS and ZnO layers are both present in the photovoltaic cell; in other embodiments, only one of CdS and ZnO is present.

In some embodiments, a layer of a sodium compound (e.g., NaF, $Na_2S$, or $Na_2Se$) is formed above and/or below the crystalline $Fe_2XY_4$-containing layer. The layer of the sodium compound can be applied by sputtering, evaporation, chemical bath deposition, electroplating, sol-gel based coatings, spray coating, chemical vapor deposition, physical vapor deposition, or atomic layer deposition.

A film fabricated on a substrate as described above can be incorporated into an electronic device to serve, for example, as an absorber layer in a photovoltaic device, module, or solar panel. The typical solar cell includes a transparent substrate (such as soda-lime glass), a back contact layer (e.g. molybdenum), an absorber layer (also referred to as the first semiconductor layer), a buffer layer (e.g. CdS; also referred to as the second semiconductor layer), and a top electrical contact. The solar cell may also include an electrical contact or electrode pad on the top contact layer, and an antireflective (AR) coating on the front surface of the substrate to enhance the initial transmission of light into the semiconductor material. The FIGURE illustrates the above features in the stack shown therein, which contains the following elements: transparent substrate 1; back contact layer 2; absorber layer 3 (which is formed from the $Fe_2XY_4$ precursors hereof, including the $Fe_2XY_4$ nanoparticles described herein); buffer layer 4; top contact layer 5 [which can be, for example, a transparent conducting oxide ("TCO") such as zinc oxide doped with aluminum]; and the electrical contact or electrode pad on the top contact layer 6.

The substrate may be made, for example, of a metal foil, such as titanium, aluminum, stainless steel, molybdenum, or a plastic or polymer, such as a polyimide (PI), polyamide, polyetheretherketone (PEEK), polyethersulfone (PES), polyetherimide (PEI), polyethylene naphthalate (PEN), polyester (PET), or a metallized plastic. The base electrode may be made of an electrically conductive material such as a layer of Al foil, e.g., about 10 microns to about 100 microns thick. An optional interfacial layer may facilitate bonding of the electrode to the substrate. The interfacial (adhesion) layer can be comprised of a variety of materials, including without limitation chromium, vanadium, tungsten, and glass, or compounds such as nitrides, oxides, and/or carbides. The $Fe_2XY_4$ absorber layer may be about 0.5 micron to about 5 microns thick after annealing, and more preferably from about 0.5 microns to about 2 microns thick after annealing.

The n-type semiconductor thin film (sometimes referred to as a junction partner layer) may include, for example, inorganic materials such as cadmium sulfide (CdS), zinc sulfide (ZnS), zinc hydroxide, zinc selenide (ZnSe), n-type organic materials, or some combination of two or more of these or similar materials, or organic materials such as n-type polymers and/or small molecules. Layers of these materials may be deposited, for example, by chemical bath deposition (CBD) and/or chemical surface deposition (and/or related methods), to a thickness ranging from about 2 nm to about 1000 nm, more preferably from about 5 nm to about 500 nm, and most preferably from about 10 nm to about 300 nm. This may also configured for use in a continuous roll-to-roll and/or segmented roll-to-roll and/or a batch mode system.

The transparent electrode may include a transparent conductive oxide layer such as zinc oxide (ZnO), aluminum doped zinc oxide (ZnO:Al), indium tin oxide (ITO), or cadmium stannate, any of which can be deposited using any of a variety of means including but not limited to sputtering, evaporation, CBD, electroplating, CVD, PVD, ALD, and the like. Alternatively, the transparent electrode may include a transparent conductive polymeric layer, e.g. a transparent layer of doped PEDOT (poly-3,4-ethylenedioxythiophene), which can be deposited using spin, dip, or spray coating, and the like. PSS:PEDOT is a doped conducting polymer based on a heterocyclic thiophene ring bridged by a diether. A water dispersion of PEDOT doped with poly(styrenesulfonate) (PSS) is available from H. C. Starck of Newton, Mass. under the trade name of Baytron® P. The transparent electrode may further include a layer of metal (e.g., Ni, Al or Ag) fingers to reduce the overall sheet resistance. Alternatively, the transparent conductor layer may comprise a carbon nanotube-based transparent conductor.

The operation and effects of certain embodiments of the inventions hereof may be more fully appreciated from a series of examples as described below. The embodiments on which these examples are based are representative only, and the selection of those embodiments to illustrate the invention does not indicate that materials, components, reactants, configurations, designs, conditions, specifications, steps, techniques not described in the examples are not suitable for use herein, or that subject matter not described in the examples is excluded from the scope of the appended claims and equivalents thereof.

Although the invention is illustrated and described herein with reference to specific embodiments, the invention is not intended to be limited to the details shown. Rather, various modifications may be made in the details within the scope and range of equivalents of the claims and without departing from the invention.

EXAMPLES

Example 1

Preparation of Nanoprecursor Mixture to $Fe_2SiS_4$

All reagents, except for $FeCl_2$ were purchased from Sigma Aldrich and used without further purification. Iron (II) chloride ($FeCl_2$, 99.5%) was purchased from Alfa Aesar. The nanoprecursors (NPs) mixture for the preparation of $Fe_2SiS_4$ was obtained by combining 0.253 g of $FeCl_2$ and 0.128 g of S, each dissolved by sonication in 10 mL of oleylamine at 104° C., with 0.028 g Si nanopowder with particle size <100 nm (predispersed in oleylamine at 104° C.). The dispersions were then combined and reacted at 220° C.

The mixtures were further heated for 2 hours under inert atmosphere (argon). The particles were recovered by precipitation with anti-solvents followed by centrifugation. Several washing steps to remove residual organic groups were performed, by repeating the dispersion precipitation step. The preparation led to a uniform mixture of nanoparticles of Si and $FeS_2$, based on a TEM image of the powder. The particle size of all particles present in the mixture was below 200 nm.

Example 2

Preparation of $Fe_2GeS_4$ Ternary Nanomaterial

Oleylamine solutions, prepared from dissolution of 0.253 g of $FeCl_2$, 0.580 g of $GeI_4$ and 0.128 g of S, each in 10 mL oleylamine at 104° C., were mixed and heated to 220° C. for two hours. The particles were recovered by precipitation with hexanes:ethanol in a 1:1 ratio, followed by centrifugation. Several washing steps to remove residual organic groups were performed, by repeating twice the dispersion in toluene and precipitation in hexanes:ethanol in a 1:1 ratio steps. The preparation led to a uniform mixture of nanoparticles of Ge and $FeS_2$ based on a TEM image of the powder. The particle size of all particles present in the mixture was below 100 nm. Plate-like particles have been observed by TEM imaging and the composition was identified by XPS.

Example 3

Preparation of Amorphous Precursors Mixture to $Fe_2GeS_4$ Ternary Crystalline Materials Oleylamine solutions, prepared from dissolution of 0.253 g of $FeCl_2$, 0.580 g of $GeI_4$ and 0.128 g of S, each in 10 mL oleylamine at 104° C., were mixed and heated to 220° C. for one hour. The resulting dark-colored powder was recovered by precipitation with hexanes:ethanol in a 1:1 ratio, followed by centrifugation. Several washing steps to remove residual organic groups were performed, by repeating twice the dispersion in toluene and precipitation in hexanes:ethanol in a 1:1 ratio steps. The preparation led to an amorphous mixture based on a TEM image of the powder. Temperature treatment of this amorphous precursor powder with stoichiometric composition of Fe:Ge:S of 2:1:4 led to crystalline $Fe_2GeS_4$ (as confirmed by XRD).

Example 4

Synthesis of $Fe_2GeS_4$ Nanoplates by Microwave-assisted Synthesis

Stoichiometric amounts of 353 mg (1 mmol) of $Fe(acac)_3$, 290 mg (0.5 mmol) of $GeI_4$ and 64 mg (2 mmol) sulfur were dissolved in 5 mL oleylamine each at 100° C. and added to a 20 mL microwave vial (Biotage) equipped with stirring bar and containing 5 mL oleylamine heated at 100° C. The vial was sealed and inserted in a microwave reactor cavity (Biotage Initiator Reactor). The reaction was carried out at 260° C. for 30 minutes. The TEM analysis showed fine 2D platelets.

Example 5

Ability of Nanoparticles to Form Crystalline $Fe_2SiS_4$ and $Fe_2GeS_4$

The precursors' capability of generating crystalline $Fe_2SiS_4$ and $Fe_2GeS_4$ has been characterized by Temperature Dependent X-Ray Powder Diffraction (TD-XRD). Formation of crystalline $Fe_2SiS_4$ and $Fe_2GeS_4$ was observed at temperatures as low as 500° C.

Example 6

Deposition of Nanoprecursors Layer

The nanoprecursors, prepared as dispersions in organic solvents with sulfur content (such as thiols, dithiocarbamates, and disulfides), were deposited by spin-coating, spray-coating and rod-coating, on molybdenum-coated 1"×1" substrates. One to five layers of nanoprecursor mixtures were deposited for each sample. The thickness of each coated layer was in the range of 300-500 nm (as determined by SEM analysis of FIB processed sections).

Example 7

Processing

The nanoprecursors films (coatings) were subjected to a thermal treatment step. The annealing procedure was performed in a tube furnace, under an argon atmosphere and in the presence of sulfur to preclude sulfur loss. The annealing temperature typically was in the range of 450° C. to 650° C. The annealed films were characterized by XPS. Despite air sensitivity indicated by the presence of oxygen, the films' compositions were nearly stoichiometric (iron-poor $Fe_{1.5}GeS_4$ crystalline film).

Example 8

Microwave Assisted Processing of Nanoparticle Films

The nanoparticle films (coatings) prepared as described in Example 6 were subjected to a thermal treatment step in a modified microwave furnace. The annealing procedure was performed in a graphite box, with and without presence of sulfur. The power was adjusted to correspond to an annealing temperature of 400° C. to 650° C. The annealed films were characterized by XRD. Despite air sensitivity indicated by the presence of oxygen, the films' compositions and purity were confirmed.

Example 9

Microwave Assisted Processing of Amorphous Powders Films

The amorphous powders films (coatings) prepared as described in Example 6 were subjected to a thermal treatment step in a modified microwave furnace. The annealing procedure was performed in a graphite box, with and without presence of sulfur. The power was adjusted to correspond to an annealing temperature of 400° C. to 650° C. The annealed films were characterized by XRD. Despite air sensitivity indicated by the presence of oxygen, the films' compositions and purity were confirmed.

Example 10

Fabrication of Solar Devices

Device fabrication followed the structure of CIGS using CdS as buffer layer or ZnS. The CdS layer deposition was performed by chemical bath deposition and ZnS was deposited by vacuum sputtering. Diode behavior and small photocurrents (0.003 mA) were recorded.

What is claimed is:

1. An ink comprising:
   a) a plurality of nanoparticles which are precursors to a crystalline thin film comprised of $Fe_2XY_4$, wherein X is selected from the group consisting of Si, Ge and combinations thereof and Y is selected from the group consisting of S, Se and combinations thereof, wherein the nanoparticles have an average longest dimension of from about 1 nm to about 500 nm; and
   b) a solvent.

2. The ink of claim 1, wherein the nanoparticles comprise nanoparticles of $FeS_2$ and nanoparticles of elemental Ge and/or elemental Si.

3. The ink of claim 1, wherein the nanoparticles comprise nanoparticles of $FeS_2$ and nanoparticles of GeS.

4. The ink of claim 1, wherein the nanoparticles comprise nanoparticles of $Fe_2XS_4$, wherein X is selected from the group consisting of Si, Ge and combinations thereof.

5. The ink of claim 1, wherein all of the nanoparticles have a particle size of less than 200 nm.

6. A coated substrate comprising:
   a) a substrate; and
   b) a layer disposed on the substrate comprising an ink in accordance with claim 1.

7. A method of providing a crystalline thin film comprised of $Fe_2XY_4$, wherein X is selected from the group consisting of Si, Ge and combinations thereof and Y is selected from the group consisting of S, Se and combinations thereof, on a substrate, comprising the steps of:
   a) coating the substrate with at least one layer of an ink in accordance with claim 1; and
   b) heating the layer for a time and at a temperature effective to convert the plurality of nanoparticles into the crystalline thin film comprised of $Fe_2XY_4$.

8. The ink of claim 1, wherein the solvent is an organic solvent.

* * * * *